(12) United States Patent
Yoon et al.

(10) Patent No.: US 10,622,520 B2
(45) Date of Patent: Apr. 14, 2020

(54) SEMICONDUCTOR LIGHT EMITTING DEVICE WITH INCREASED REFLECTANCE AND LIGHT EMISSION EFFICIENCY, AND SUPPRESSED PEELING OR MIGRATION OF THE REFLECTIVE METAL

(71) Applicant: Samsung Electronics Co., Ltd., Suwon-si, Gyeonggi-do (KR)

(72) Inventors: Ju Heon Yoon, Seoul (KR); Jung Hwan Kil, Suwon-si (KR); Tae Hun Kim, Bucheon-si (KR); Hwa Ryong Song, Osan-si (KR); Jae In Sim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/045,951

(22) Filed: Jul. 26, 2018

(65) Prior Publication Data

US 2019/0229242 A1    Jul. 25, 2019

(30) Foreign Application Priority Data

Jan. 25, 2018  (KR) .................. 10-2018-0009229

(51) Int. Cl.
*H01L 33/40* (2010.01)
*H01L 33/62* (2010.01)
(Continued)

(52) U.S. Cl.
CPC ............ *H01L 33/405* (2013.01); *H01L 33/12* (2013.01); *H01L 33/20* (2013.01); *H01L 33/32* (2013.01); *H01L 33/382* (2013.01); *H01L 33/42* (2013.01); *H01L 33/62* (2013.01); *H01L 25/0753* (2013.01); *H01L 2933/0016* (2013.01)

(58) Field of Classification Search
CPC ......... H01L 33/12; H01L 33/20; H01L 33/32; H01L 33/405; H01L 33/42; H01L 33/62
See application file for complete search history.

(56) References Cited

U.S. PATENT DOCUMENTS 6,372,608 B1   4/2002   Shimoda et al.
6,630,689 B2   10/2003  Bhat et al.
(Continued)

FOREIGN PATENT DOCUMENTS

JP     2011-071316 A    4/2011
KR   10-2012-0027318 A   3/2012
(Continued)

*Primary Examiner* — Andrew Q Tran
(74) *Attorney, Agent, or Firm* — Lee IP Law, P.C.

(57) ABSTRACT

A semiconductor light emitting device includes a light-emitting structure including a first conductivity-type semiconductor layer, an active layer, and a second conductivity-type semiconductor layer, a first transparent electrode layer on the second conductivity-type semiconductor layer, a first insulating layer on the first transparent electrode layer, the first insulating layer including a plurality of through-holes, a reflective electrode layer on the first insulating layer and connected to the first transparent electrode layer through the plurality of through-holes, and a transparent protection layer covering upper and side surfaces of the reflective electrode layer, the transparent protection layer being on a portion of the first insulating layer.

10 Claims, 21 Drawing Sheets

(51) Int. Cl.
*H01L 33/32* (2010.01)
*H01L 33/12* (2010.01)
*H01L 33/20* (2010.01)
*H01L 33/42* (2010.01)
*H01L 33/38* (2010.01)
*H01L 25/075* (2006.01)

(56) References Cited

U.S. PATENT DOCUMENTS

| | | | |
|---|---|---|---|
| 6,645,830 | B2 | 11/2003 | Shimoda et al. |
| RE38,466 | E | 3/2004 | Inoue et al. |
| 6,720,585 | B1 | 4/2004 | Wasserbauer et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,119,372 | B2 | 10/2006 | Stokes et al. |
| 7,154,124 | B2 | 12/2006 | Han et al. |
| 7,166,483 | B2 | 1/2007 | Liu et al. |
| 7,208,725 | B2 | 4/2007 | Sherrer et al. |
| 7,288,758 | B2 | 10/2007 | Sherrer et al. |
| 7,291,865 | B2 | 11/2007 | Kojima et al. |
| 7,319,044 | B2 | 1/2008 | Han et al. |
| 7,326,967 | B2 | 2/2008 | Hsieh et al. |
| 7,375,380 | B2 | 5/2008 | Asahara et al. |
| 7,501,656 | B2 | 3/2009 | Han et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,368,100 | B2 | 2/2013 | Donofrio et al. |
| 8,399,944 | B2 | 3/2013 | Kwak et al. |
| 8,432,511 | B2 | 4/2013 | Jeong |
| 8,459,832 | B2 | 6/2013 | Kim |
| 8,487,334 | B2 | 7/2013 | Chae et al. |
| 8,502,242 | B2 | 8/2013 | Kim |
| 8,536,604 | B2 | 9/2013 | Kwak et al. |
| 8,735,931 | B2 | 5/2014 | Han et al. |
| 8,766,295 | B2 | 7/2014 | Kim |
| 8,823,031 | B2 | 9/2014 | Kususe et al. |
| 9,048,409 | B2 | 6/2015 | Seo et al. |
| 9,070,851 | B2 | 6/2015 | Seo et al. |
| 9,263,652 | B2 | 2/2016 | Yoon et al. |
| 9,530,941 | B2 | 12/2016 | Jeon et al. |
| 9,570,660 | B2 | 2/2017 | Sim et al. |
| 10,062,672 | B2 * | 8/2018 | Lee ............... H01L 24/16 |
| 2008/0042145 | A1 | 2/2008 | Hagleitner et al. |
| 2008/0173885 | A1 | 7/2008 | Kuromizu |
| 2009/0283787 | A1 | 11/2009 | Donofrio et al. |
| 2013/0069095 | A1 | 3/2013 | Hodota |
| 2014/0131758 | A1 * | 5/2014 | Shinohara ............ H01L 33/382 |
| | | | 257/99 |

FOREIGN PATENT DOCUMENTS

| | | |
|---|---|---|
| KR | 10-1156118 B1 | 6/2012 |
| KR | 10-2013-0125536 A | 11/2013 |
| KR | 10-1362081 | 2/2014 |
| KR | 10-2015-0137618 A | 12/2015 |
| KR | 10-2016-0028681 A | 3/2016 |
| KR | 10-2016-0046538 A | 4/2016 |
| KR | 10-2016-0084992 A | 7/2016 |
| KR | 10-2017-0076633 A | 7/2017 |
| KR | 10-2017-0120962 A | 11/2017 |

* cited by examiner

SEMICONDUCTOR LIGHT EMITTING DEVICE WITH INCREASED REFLECTANCE AND LIGHT EMISSION EFFICIENCY, AND SUPPRESSED PEELING OR MIGRATION OF THE REFLECTIVE METAL

CROSS-REFERENCE TO RELATED APPLICATION

Korean Patent Application No. 10-2018-0009229, filed on Jan. 25, 2018, in the Korean Intellectual Property Office, and entitled: "Semiconductor Light Emitting Device," is incorporated by reference herein in its entirety.

BACKGROUND

1. Field

The present disclosure relates to a semiconductor light emitting device.

2. Description of the Related Art

Semiconductor light emitting devices are commonly known as next-generation light sources due to inherent advantages thereof, e.g., relatively long lifespans, low power consumption, fast response times, and environmental friendliness, as compared to conventional light sources. In addition, semiconductor light emitting devices are prominent as important light sources in various products, e.g., illumination apparatuses or in the backlights of display devices.

SUMMARY

According to an example embodiment, a semiconductor light emitting device may include a light-emitting structure including a first conductivity-type semiconductor layer, an active layer, and a second conductivity-type semiconductor layer, a first transparent electrode layer on the second conductivity-type semiconductor layer, a first insulating layer on the first transparent electrode layer and including a plurality of through-holes, a reflective electrode layer on the first insulating layer and connected to the first transparent electrode layer through the plurality of through-holes, and a transparent protection layer covering upper and side surfaces of the reflective electrode layer, the transparent protection layer being on a portion of the first insulating layer.

According to an example embodiment, a semiconductor light emitting device may also include a light-emitting structure having a laminate structure of a first conductivity-type semiconductor layer, an active layer, and a second conductivity-type semiconductor layer and having a recess region in which the second conductivity-type semiconductor layer, the active layer, and a portion of the first conductivity-type semiconductor layer are etched and a mesa region disposed adjacent to the recess region, a first transparent electrode layer disposed on the second conductivity-type semiconductor layer, a first insulating layer covering the first transparent electrode layer and having a plurality of through-holes disposed in the mesa region, a second transparent electrode layer disposed on the first insulating layer and in contact with the first transparent electrode layer through the plurality of through-holes, a reflective electrode layer disposed on the second transparent electrode layer, and a transparent protection layer covering upper and side surfaces of the reflective electrode layer and disposed on a portion of the first insulating layer.

According to an example embodiment, a semiconductor light emitting device may also include a substrate, at least one light-emitting structure including a first conductivity-type semiconductor layer, an active layer, and a second conductivity-type semiconductor layer, sequentially stacked on the substrate, a first transparent electrode layer connected to the second conductivity-type semiconductor layer, a first insulating layer partially covering the first transparent electrode layer, a second transparent electrode layer passing through the first insulating layer and connected to the first transparent electrode layer, a reflective electrode layer connected to the second transparent electrode layer, a transparent protection layer covering upper and side surfaces of the reflective electrode layer and disposed on a portion of the first insulating layer, a first connection electrode passing through the active layer and the second conductivity-type semiconductor layer and connected to the first conductivity-type semiconductor layer, and a second connection electrode passing through the transparent protection layer and connected to the reflective electrode layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
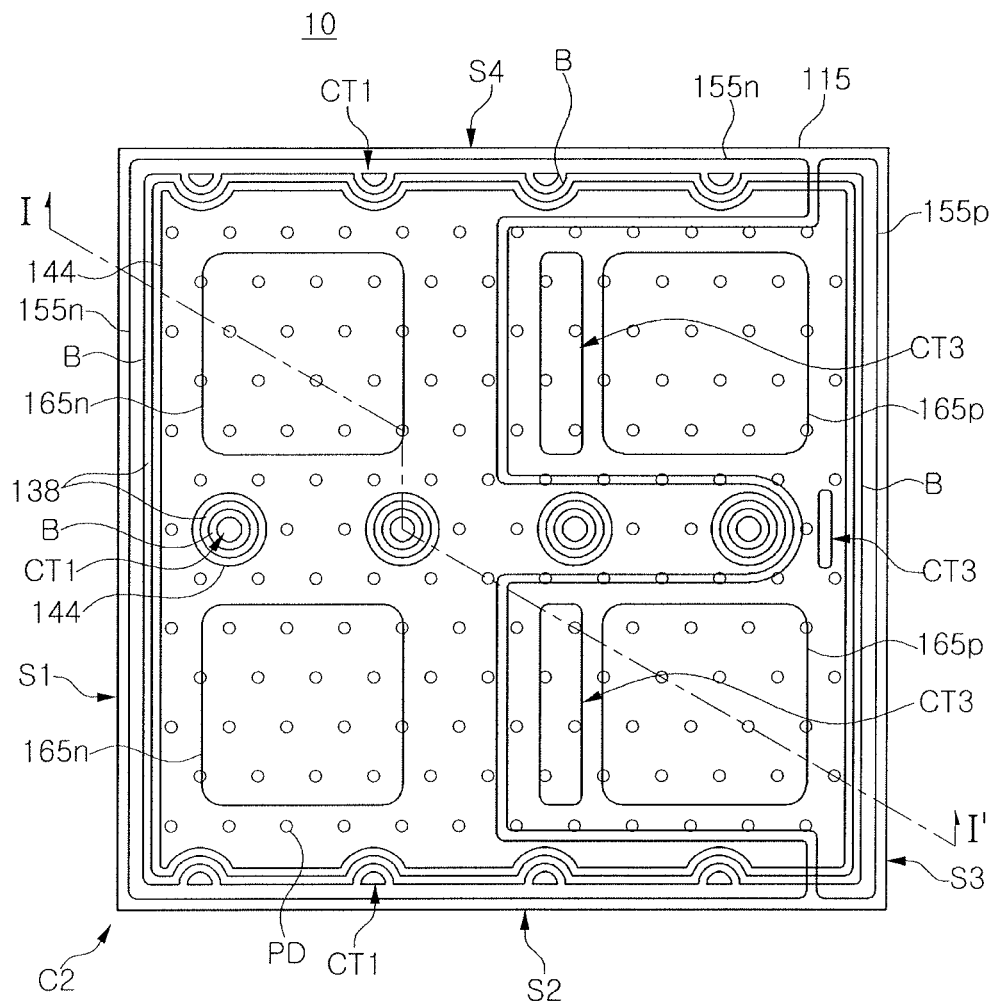
FIG. 1 illustrates a schematic plan view of a semiconductor light emitting device according to an example embodiment.
Figure 2:
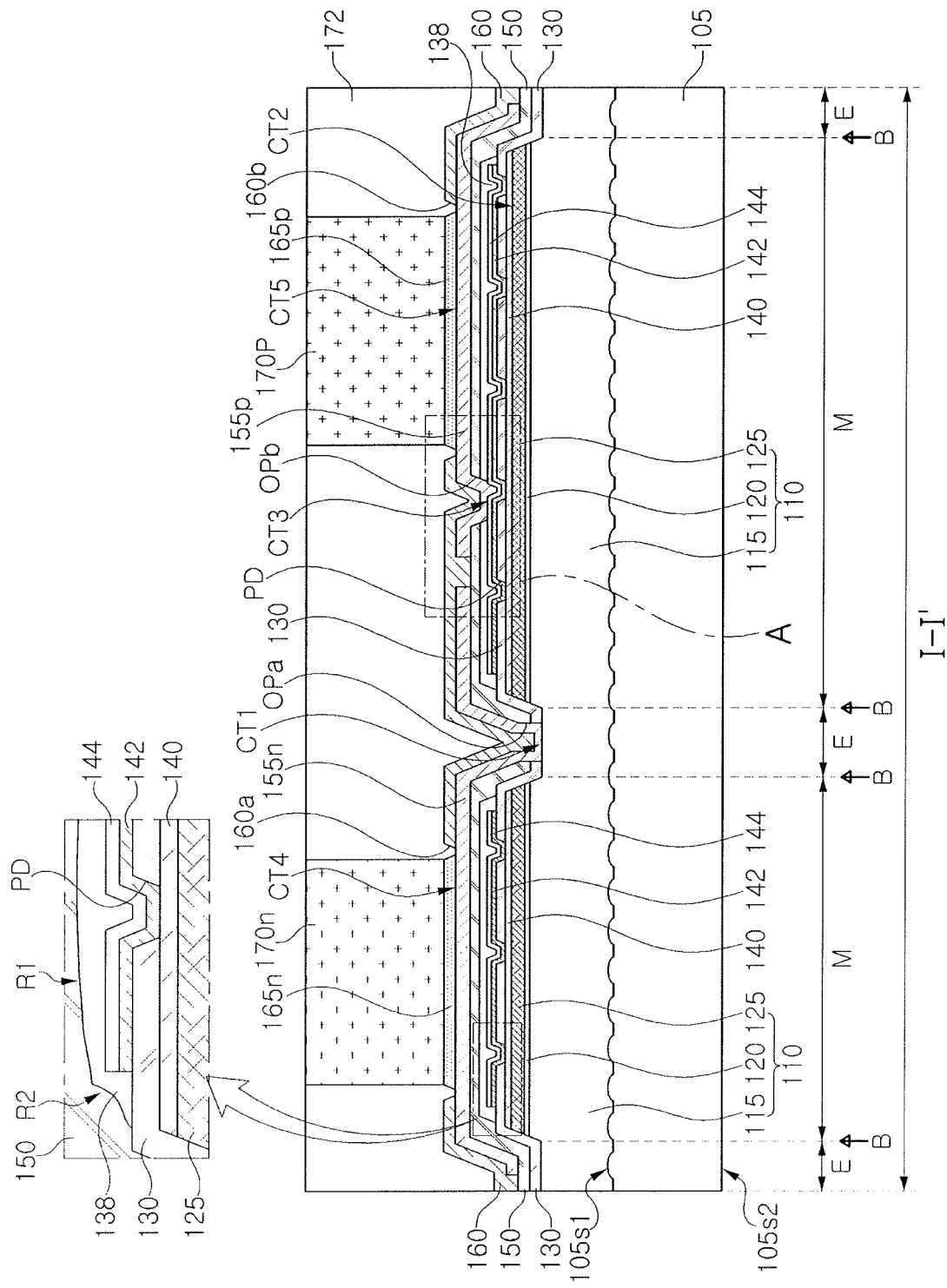
FIG. 2 illustrates a schematic cross-sectional view along line I-I' of FIG. 1.

FIG. 1 is a plan view schematically illustrating a semiconductor light emitting device 10 according to an example embodiment, and FIG. 2 is a cross-sectional view schematically illustrating an area taken along line I-I' of FIG. 1.

First, the semiconductor light emitting device 10 according to the example embodiment is described with reference to FIGS. 1 and 2.

Referring to FIGS. 1 and 2, the semiconductor light emitting device 10 according to the example embodiment may include a substrate 105, a light-emitting structure 110, a first insulating layer 130, a second insulating layer 150, a third insulating layer 160, a first transparent electrode layer 140, a second transparent electrode layer 142, a reflective electrode layer 144, a transparent protection layer 138, a first connection electrode 155n, a second connection electrode 155p, a first electrode pad 165n, a second electrode pad 165p, a first solder pillar 170n, and a second solder pillar 170p.

The substrate 105 may have a front surface 105s1 and a rear surface 105s2 opposed to the front surface 105s1. The substrate 105 may be a substrate for growing a semiconductor material, and may be formed of an insulating material, a conductive material, or a semiconductor material, e.g., sapphire, Si, SiC, $MgAl_2O_4$, MgO, $LiAlO_2$, $LiGaO_2$, or GaN. The sapphire may be used as a substrate for growing a nitride semiconductor material.

Throughout this disclosure, although terms such as "front surface" and "rear surface" may be used to describe the relationship of one element to another, embodiments are not be limited by these terms. Accordingly, terms such as "front surface" and "rear surface" may be replaced by terms such as "first surface" and "second surface" or terms such as "upper surface" and "lower surface" to describe elements in the disclosure. Accordingly, the front surface 105s1 of the substrate 105 and the rear surface 105s2 may be replaced by an upper surface 105s1 and a lower surface 105s2 of the substrate 105, or a first surface 105s1 and a second surface 105s2 of the substrate 105.

The light-emitting structure 110 may be disposed on the front surface 105s1 of the substrate 105. In some example embodiments, the front surface 105s1 of the substrate 105 may have a concavo-convex structure, which improves crystallinity of semiconductor layers configuring the light-emitting structure 110 and light emission efficiency of the light-emitting structure 110. In the example embodiment, the concavo-convex structure of the front surface 105s1 of the substrate 105 may have a dome-like convex shape, but is not limited thereto. For example, the concavo-convex structure of the front surface 105s1 of the substrate 105 may have a variety of shapes, e.g., a tetragonal shape or a triangular shape. In addition, the concavo-convex structure of the front surface 105s1 of the substrate 105 may be selectively formed or omitted.

In some example embodiments, the substrate 105 may be removed in a subsequent process. For example, the substrate 105 may be provided as a growth substrate for growing the light-emitting structure 110 and then removed through a separation process. The substrate 105 may be separated from the light-emitting structure 110 by a laser lift-off (LLO) method, a chemical lift-off (CLO) method, or the like.

Although not illustrated in the drawings, a buffer layer may be further formed on the front surface 105s1 of the substrate 105. The buffer layer may serve to reduce lattice defects of the semiconductor layers grown on the substrate 105, and may be formed of an undoped semiconductor layer including a nitride material. The buffer layer may include, e.g., undoped GaN, AlN, InGaN, or the like, and may be grown to several tens to several hundreds of angstroms (Å) at a low temperature in the range of 500° C. to 600° C. Here, the term "undoped" means that the semiconductor layer is not subjected to a separate impurity-doping process. However, the buffer layer may be omitted in some example embodiments.

The light-emitting structure 110 may include a first conductivity-type semiconductor layer 115, an active layer 120, and a second conductivity-type semiconductor layer 125. For example, the first conductivity-type semiconductor layer 115, the active layer 120, and the second conductivity-type semiconductor layer 125 may be directly stacked on the substrate 105 in the stated order.

The first conductivity-type semiconductor layer 115 may be grown from the front surface 105s1 of the substrate 105. The first conductivity-type semiconductor layer 115 may be a semiconductor layer doped with n-type impurities, e.g., an n-type nitride semiconductor layer.

In a plan view, the first conductivity-type semiconductor layer 115 may have a quadrangular shape, as illustrated in FIG. 1. The first conductivity-type semiconductor layer 115 may have a first edge S1, a second edge S2, a third edge S3, and a fourth edge S4. Accordingly, the first and third edges S1 and S3 may face each other, and the second and fourth edges S2 and S4 may face each other.

The second conductivity-type semiconductor layer 125 may be a semiconductor layer doped with p-type impurities, e.g., a p-type nitride semiconductor layer. In some example embodiments, positions of the first conductivity-type semiconductor layer 115 and the second conductivity-type semiconductor layer 125 may be exchanged. The first conductivity-type semiconductor layer 115 and the second conductivity-type semiconductor layer 125 may include a material represented by a composition formula $Al_xIn_yGa_{(1-x-y)}N$ (here, $0 \leq x < 1$, $0 \leq y < 1$, and $0 \leq x+y < 1$). For example, the first conductivity-type semiconductor layer 115 and the second conductivity-type semiconductor layer 125 may include GaN, AlGaN, InGaN, or AlInGaN.

The active layer 120 may be interposed between the first conductivity-type semiconductor layer 115 and the second conductivity-type semiconductor layer 125. The active layer 120 may emit light having a predetermined amount of energy, generated by electron-hole recombination when the semiconductor light emitting device 10 operates. The active layer 120 may include a material having a smaller energy bandgap than the first conductivity-type semiconductor layer 115 and the second conductivity-type semiconductor layer 125. For example, when the first conductivity-type semiconductor layer 115 and the second conductivity-type semiconductor layer 125 are a GaN-based compound semiconductor material, the active layer 120 may include an InGaN-based compound semiconductor material having a smaller energy bandgap than GaN. In addition, the active layer 120 may have a multiple quantum well (MQW) structure, e.g., an InGaN/GaN structure, in which quantum well layers and quantum barrier layers are alternately stacked. However, the active layer 120 is not limited thereto, and may have a single quantum well (SQW) structure.

As illustrated in FIG. 2, the light-emitting structure 110 may include a recess region E in which the second conductivity-type semiconductor layer 125, the active layer 120, and a portion of the first conductivity-type semiconductor layer 115 are etched, and a mesa region M disposed around the recess region E, e.g., the mesa region M may completely surround a perimeter of at least some of the recess region E in a top view. In the drawings, the reference character "B" represents a boundary B between the recess region E and the mesa region M. An upper surface of the mesa region M may be higher than an upper surface the recess region E. In some example embodiments, the mesa region M may become narrower toward a bottom thereof. Accordingly, the mesa region M may have an inclined side surface.

In some example embodiments, a portion of the upper surface of the recess region E may be defined as a first contact area CT1. In some example embodiments, at least a portion of the upper surface of the mesa region M may be defined as a second contact area CT2.

The mesa region M may be spaced apart from the first to fourth edges S1 to S4, and the recess region E may be arranged between the mesa region M and the first to fourth edges S1 to S4. In addition, a plurality of recess areas E having a circular shape and spaced apart from each other may be arranged in a center portion of the light-emitting structure 110, as illustrated in FIG. 1.

The first transparent electrode layer 140 may be disposed, e.g., directly, on the second conductivity-type semiconductor layer 125 of the light-emitting structure 110. The first transparent electrode layer 140 may be disposed at the second contact area CT2 of the second conductivity-type semiconductor layer 125 to be electrically connected to the second conductivity-type semiconductor layer 125.

The first insulating layer 130 may be disposed, e.g., directly, on the first transparent electrode layer 140. The first insulating layer 130 may cover a portion of the first conductivity-type semiconductor layer 115 and a portion of the second conductivity-type semiconductor layer 125, e.g., the first insulating layer 130 may cover a portion of an upper surface of the first conductivity-type semiconductor layer 115 and a lateral surface of the second conductivity-type semiconductor layer 125. The first insulating layer 130 may include a plurality of through-holes PD disposed in the mesa region M. The first insulating layer 130 may partially cover the first transparent electrode layer 140 in the mesa region M. In the example embodiment, the plurality of through-holes PD may be arranged in a hexagonal close-packed lattice pattern, but are not limited thereto. For example, the plurality of through-holes PD may be arranged in various patterns, e.g., a rectangular lattice pattern. Although the plurality of through-holes PD are illustrated as having circular cross-sectional areas in FIG. 1, they are not limited thereto, e.g., the plurality of through-holes PD may have polygonal or ring-shaped cross-sectional areas.

In some example embodiments, the first transparent electrode layer 140 may include a plurality of through-holes arranged to be shifted from the plurality of through-holes PD. In this case, the first insulating layer 130 may fill the plurality of through-holes of the first transparent electrode layer 140.

The first insulating layer 130 may be formed of a material having a lower refractive index than the second conductivity-type semiconductor layer 125. The first insulating layer 130 may include, e.g., at least one of $SiO_2$, SiN, $TiO_2$, HfO, and $MgF_2$. In some example embodiments, the first insulating layer 130 may have a distributed Bragg reflector (DBR) structure in which insulating layers having different refractive indices are alternately stacked.

The second transparent electrode layer 142 may be disposed on the first insulating layer 130 and may be in contact with the first transparent electrode layer 140 through the plurality of through-holes PD. The first transparent electrode layer 140 and the second transparent electrode layer 142 may include at least one of, e.g., indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$).

The reflective electrode layer 144 may be disposed, e.g., directly, on the second transparent electrode layer 142, e.g., to be conformal on the second transparent electrode layer 142. For example, the reflective electrode layer 144 and the second transparent electrode layer 142 may completely overlap each other. The second transparent electrode layer 142 may serve to improve adhesion between the reflective electrode layer 144 and the first insulating layer 130. The reflective electrode layer 144 may include, e.g., Ag, Cr, Ni, Ti, Al, Rh, Ru, or a combination thereof.

The transparent protection layer 138 may cover upper and side surfaces of the reflective electrode layer 144 to protect the reflective electrode layer 144. The transparent protection layer 138 may cover a side surface of the second transparent electrode layer 142. The transparent protection layer 138 may include an upper portion R1 covering the upper surface of the reflective electrode layer 144 and having a convex surface, and a side portion R2 covering the side surface of the reflective electrode layer 144 and the side surface of the second transparent electrode layer 142 and having an inclined surface, e.g., the upper portion R1 and the side portion R2 may be in contact and continuous with each other. For example, as illustrated in FIG. 2, the transparent protection layer 138 may continuously cover all exposed surfaces of the second transparent electrode layer 142 and the reflective electrode layer 144, e.g., the second transparent electrode layer 142 with the reflective electrode layer 144 may be enclosed between the transparent protection layer 138 and the first insulating layer 130. By forming the transparent protection layer 138, adhesion of the reflective electrode layer 144 may be improved, and migration of a metal element included in the reflective electrode layer 144 may be suppressed.

The first insulating layer 130, the second transparent electrode layer 142, and the reflective electrode layer 144 may configure an omni-directional reflector. The omni-directional reflector may increase reflectivity of light emitted from the active layer 120, thereby improving light extraction efficiency.

The transparent protection layer 138 may be formed of a transparent, conductive material or a transparent insulating material. The transparent, conductive material may include at least one of, e.g., indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$), or a conductive polymer. The transparent insulating material may include at least one of, e.g., $SiO_2$, SiN, $TiO_2$, HfO, and $MgF_2$.

The second insulating layer 150 may be disposed on the transparent protection layer 138 and the first insulating layer 130. For example, as illustrated in FIG. 2, the second insulating layer 150 may be on the upper surface of the transparent protection layer 138, and may continuously extend along side surfaces of the transparent protection layer 138 and the first insulating layer 130.

Figure 3A:
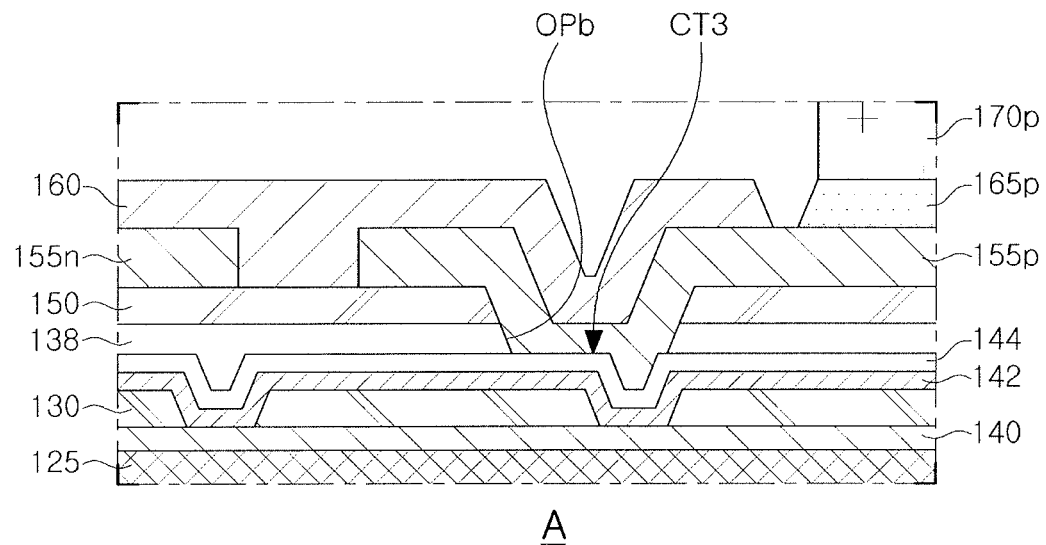
FIGS. 3A and 3B illustrate partially enlarged views of an area A of FIG. 2.

For example, referring to FIG. 3A together with FIGS. 1 and 2, when the transparent protection layer 138 is formed of the transparent insulating material, a first opening OPa, i.e., an opening passing through the first insulating layer 130 and the second insulating layer 150 to expose the first conductivity-type semiconductor layer 115, and a second opening OPb, i.e., an opening passing through the transparent protection layer 138 and the second insulating layer 150 to expose the reflective electrode layer 144, may be formed. The first opening OPa may expose the first contact area CT1 of the first conductivity-type semiconductor layer 115, and the second opening OPb may expose a third contact area CT3 of the reflective electrode layer 144. The first opening OPa may be disposed in the recess region E, and the second opening OPb may be disposed in the mesa region M.

The first connection electrode 155n may be disposed on the second insulating layer 150 and electrically connected to the first conductivity-type semiconductor layer 115 by extending onto the first contact area CT1 of the first conductivity-type semiconductor layer 115 through the first opening OPa. The first connection electrode 155n may be in contact with the first contact area CT1 of the first conductivity-type semiconductor layer 115. In some example embodiments, in order to improve contact resistance characteristics between the first connection electrode 155n and the first contact area CT1 of the first conductivity-type semiconductor layer 115, a conductive buffer layer may be disposed between the first connection electrode 155n and the first contact area CT1 of the first conductivity-type semiconductor layer 115.

The second connection electrode 155p may be disposed on the second insulating layer 150 and electrically connected to the reflective electrode layer 144 by extending onto the third contact area CT3 of the reflective electrode layer 144 through the second opening OPb. Accordingly, the second connection electrode 155p may be electrically connected to the second conductivity-type semiconductor layer 125 via the reflective electrode layer 144.

Figure 3B:
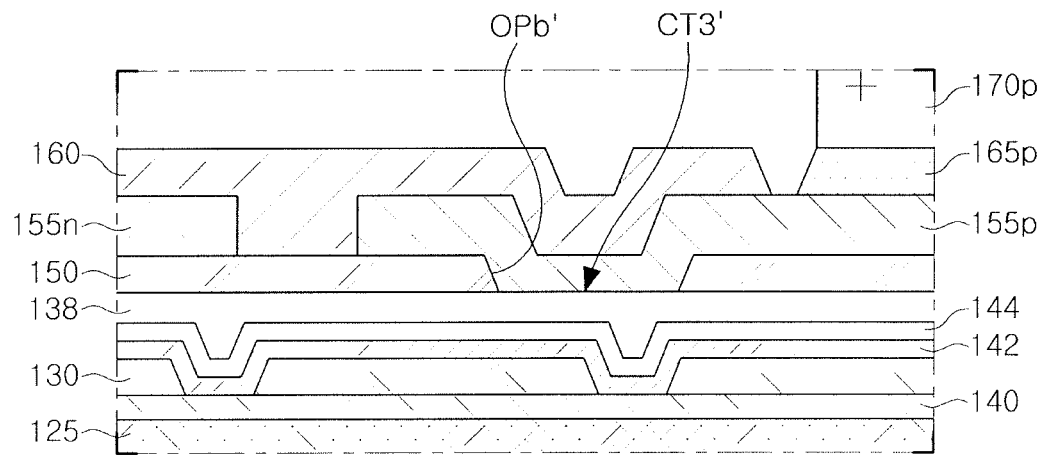

In another example, referring to FIG. 3B together with FIGS. 1 and 2, when the transparent protection layer 138 is formed of the transparent, conductive material, a second opening OPb' passing through the second insulating layer 150 to expose a third contact area CT3' of the transparent protection layer 138 may be formed, unlike that illustrated in FIG. 3A. In other words, the second opening OPb' may pass through the second insulating layer 150 to directly contact the transparent protection layer 138 (i.e., without passing through the transparent protection layer 138). The first opening OPa may be disposed in the recess region E, and the second opening OPb' may be disposed in the mesa region M.

Referring back to FIG. 2, the first connection electrode 155n may be disposed on the second insulating layer 150 and electrically connected to the first conductivity-type semiconductor layer 115 by extending onto the first contact area CT1 of the first conductivity-type semiconductor layer 115 through the first opening OPa. The first connection electrode 155n may be in contact with the first contact area CT1 of the first conductivity-type semiconductor layer 115. In some example embodiments, a conductive buffer pattern may be formed between the first connection electrode 155n and the first contact area CT1 of the first conductivity-type semiconductor layer 115 in order to improve contact resistance characteristics between the first connection electrode 155n and the first contact area CT1 of the first conductivity-type semiconductor layer 115.

The second connection electrode 155p may be disposed on the second insulating layer 150 and electrically connected to the reflective electrode layer 144 by extending onto the third contact area CT3 of the reflective electrode layer 144 through the second opening OPb. Accordingly, the second connection electrode 155p may be electrically connected to the second conductivity-type semiconductor layer 125 via the reflective electrode layer 144.

The first connection electrode 155n and the second connection electrode 155p may be disposed on the second insulating layer 150, formed of the same material, and spaced apart from each other. For example, the first connection electrode 155n and the second connection electrode 155p may be formed of a material including at least one of Al, Au, W, Pt, Si, Ir, Ag, Cu, Ni, Ti, Cr, and an alloy thereof. In a plan view, the first connection electrode 155n may be adjacent to the first edge S1, and the second connection electrode 155p may be adjacent to the third edge S3.

The third insulating layer 160 may include a third opening 160a and a fourth opening 160b on the first connection electrode 155n and the second connection electrode 155p, respectively. The third opening 160a may expose a fourth contact area CT4 of the first connection electrode 155n, and the fourth opening 160b may expose a fifth contact area CT5 of the second connection electrode 155p.

The first electrode pad 165n may be disposed on the fourth contact area CT4 of the first connection electrode 155n, and the second electrode pad 165p may be disposed on the fifth contact area CT5 of the second connection electrode 155p. The first solder pillar 170n may be disposed on the first electrode pad 165n, and the second solder pillar 170p may be disposed on the second electrode pad 165p. The first and second solder pillars 170n and 170p may be formed of a conductive material, e.g., Sn or AuSn.

A molding portion 172 may cover side surfaces of the first and second solder pillars 170n and 170p. The molding portion 172 may include light-reflective powder, e.g., $TiO_2$ or $Al_2O_3$. An upper surface of the molding portion 172 may be lower than upper surfaces of the first and second solder pillars 170n and 170p.

Figure 4:
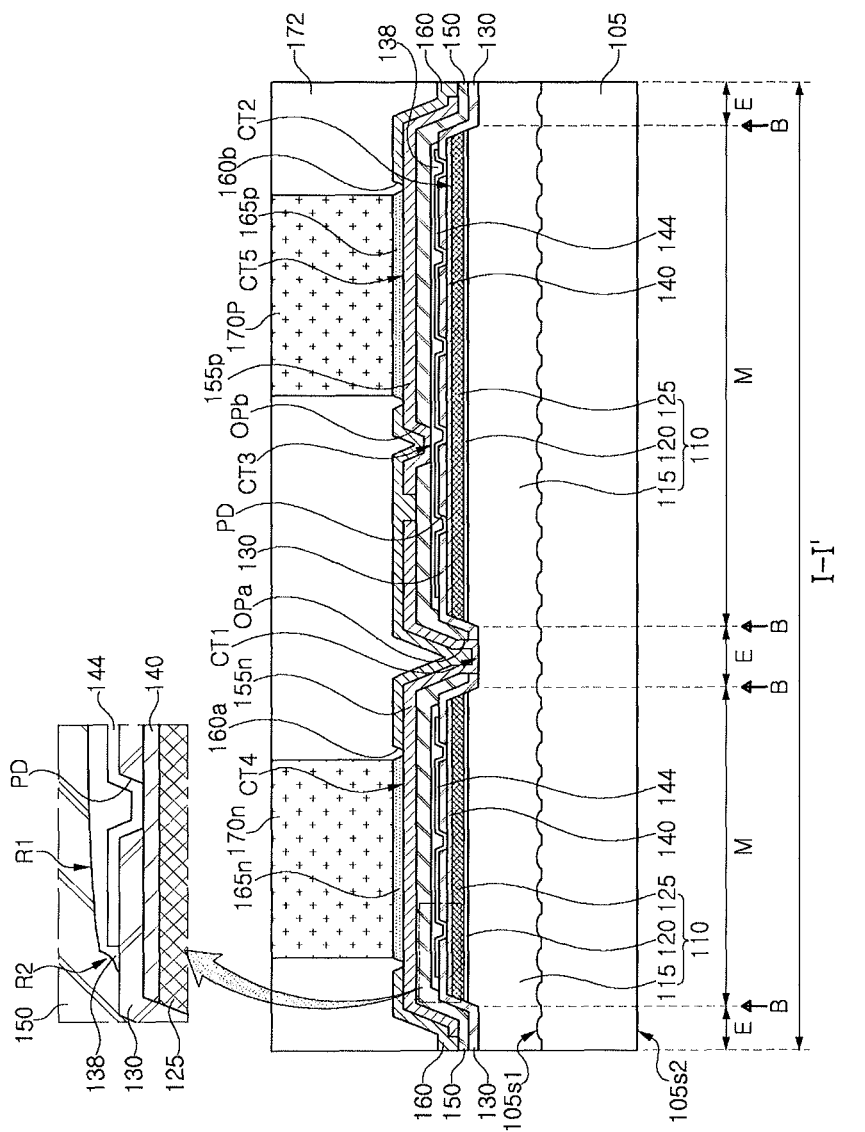
FIGS. 4 and 5 illustrate schematic cross-sectional views of semiconductor light emitting devices according to modified example embodiments.
Figure 5:
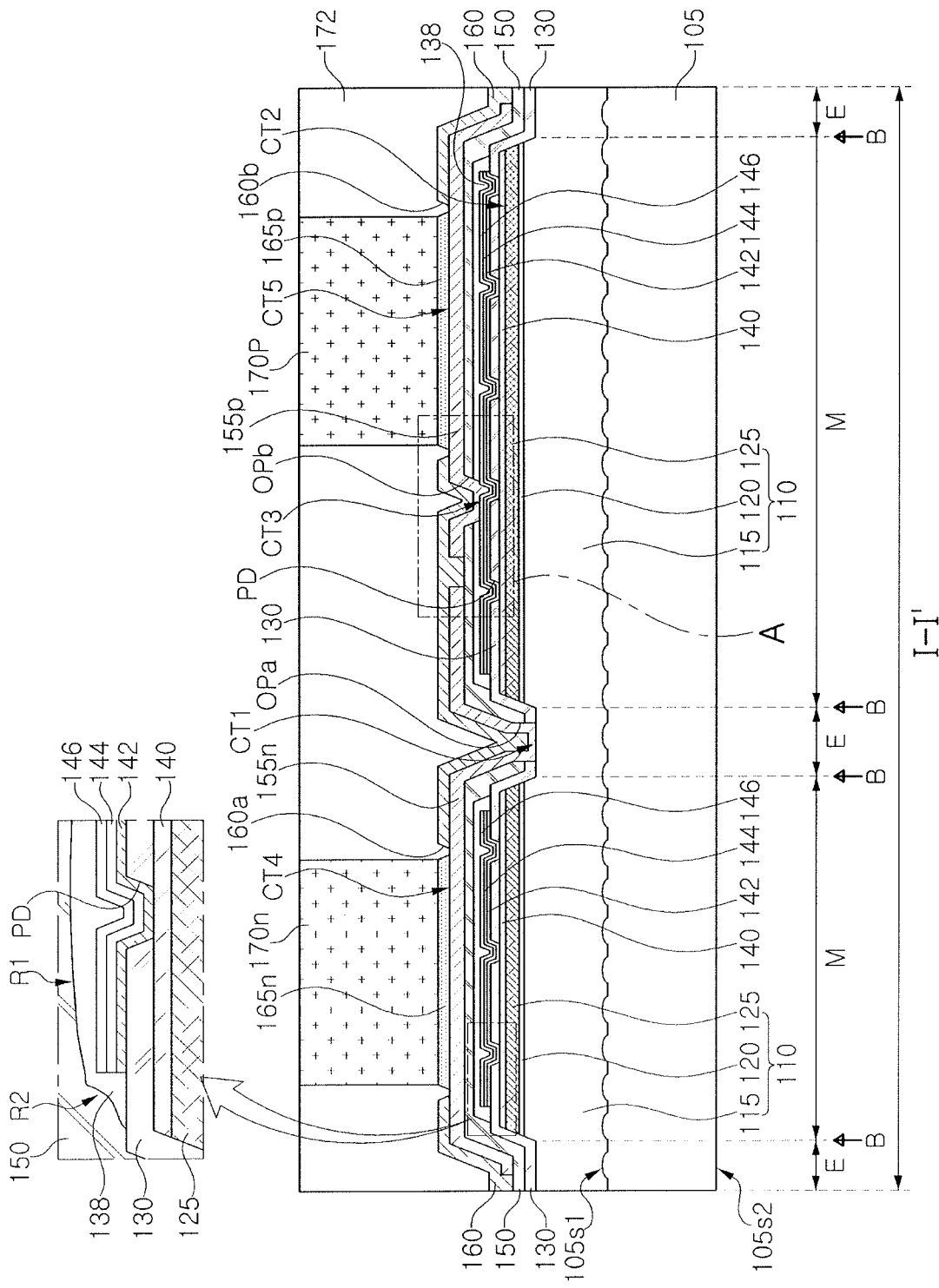

FIGS. 4 and 5 are cross-sectional views schematically illustrating semiconductor light emitting devices according to modified example embodiments. Since the semiconductor light emitting devices illustrated in FIGS. 4 and 5 have similar structures to the semiconductor light emitting device illustrated in FIG. 2, differences therebetween will mainly be explained.

Referring to FIG. 4, the reflective electrode layer 144 of the semiconductor light emitting device may be disposed directly on the first insulating layer 130, unlike that illustrated in FIG. 2. That is, the second transparent electrode layer 142 illustrated in FIG. 2 may not be formed in the example embodiment.

Referring to FIG. 5, the semiconductor light emitting device may further include a capping electrode layer 146 disposed on the reflective electrode layer 144, unlike the semiconductor light emitting device illustrated in FIG. 2. The capping electrode layer 146 may have a multilayer structure in which Ti and Ni are alternately stacked. The capping electrode layer 146 may have, e.g., a Ti/Ni/Ti/Ni/Ti multilayer structure.

Figure 6:
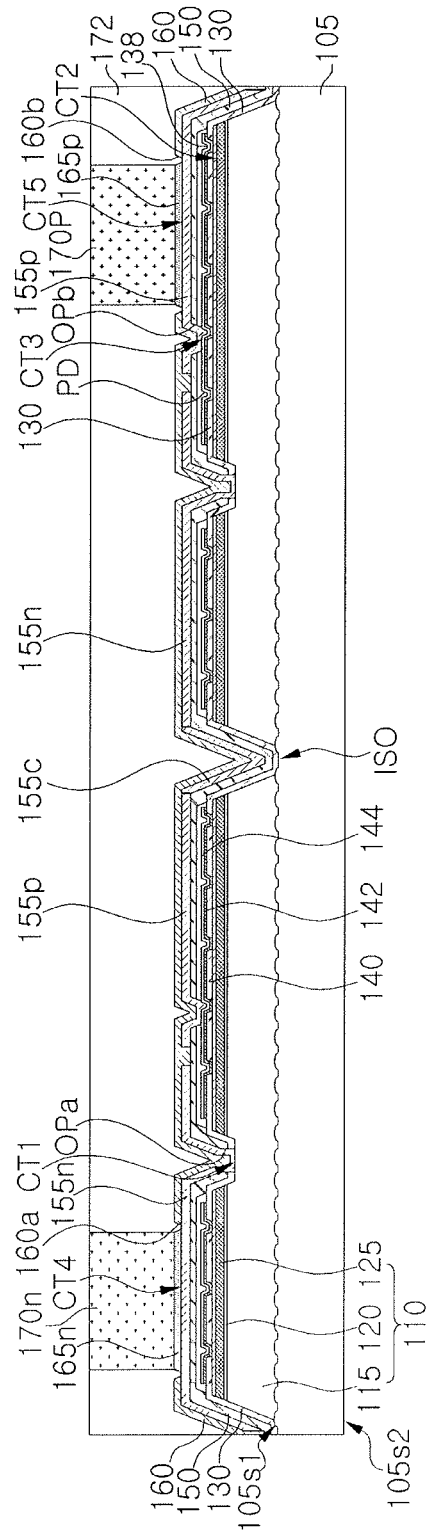
FIG. 6 illustrates a schematic cross-sectional view of a semiconductor light emitting device according to another modified example embodiment.

FIG. 6 is a cross-sectional view schematically illustrating a semiconductor light emitting device according to another modified example embodiment.

Referring to FIG. 6, the semiconductor light emitting device may include a plurality of light-emitting structures 110 disposed on the substrate 105 and separated by an isolation region ISO in which the first conductivity-type semiconductor layer 115 is removed. In the isolation region ISO, the first insulating layer 130 may be in contact with the front surface 105s1 of the substrate 105.

The plurality of light-emitting structures 110 may be electrically connected in series. The semiconductor light emitting device may further include an interconnection part 155c disposed on the isolation region ISO and connecting a first connection electrode 155n of a first light-emitting structure 110 among the plurality of light-emitting structures 110 to a second connection electrode 155p of a second light-emitting structure 110 disposed adjacent to the first light-emitting structure 110.

Next, a method of fabricating a semiconductor light emitting device 10 according to an example embodiment will be described with reference to FIGS. 7 to 20. FIGS. 7, 9, 11, 13, 15, 17, and 19 are plan views schematically illustrating the method of fabricating the semiconductor light emitting device 10 according to the example embodiment, and FIGS. 8 10, 12, 14, 16, 18, and 20 are cross-sectional views taken along line I-I' of FIGS. 7, 9, 11, 13, 15, 17, and 19, respectively.

Figure 7:
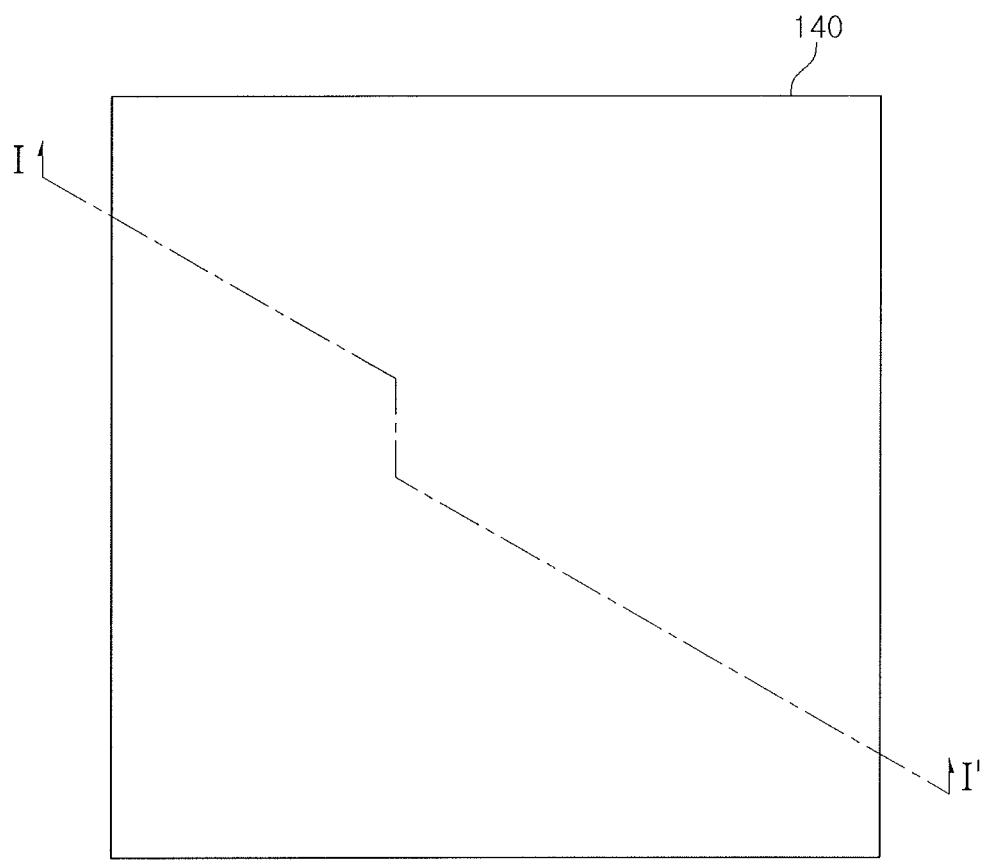
FIGS. 7, 9, 11, 13, 15, 17, and 19 illustrate schematic plan views of stages in a method of fabricating a semiconductor light emitting device according to an example embodiment.
Figure 8:
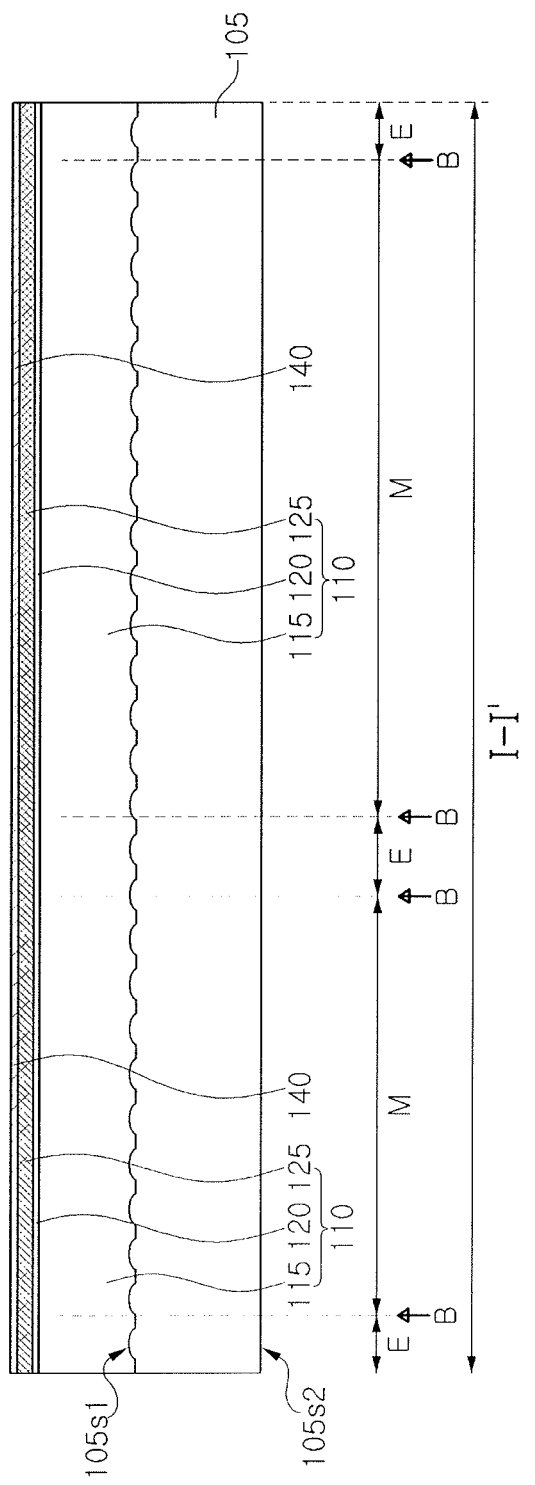
FIGS. 8, 10, 12, 14, 16, 18, and 20 illustrate schematic cross-sectional views of along line I-I' of corresponding FIGS. 7, 9, 11, 13, 15, 17, and 19.

Referring to FIGS. 7 and 8, the light-emitting structure 110 may be formed on the substrate 105. The substrate 105 may be formed of, e.g., sapphire, Si, SiC, $MgAl_2O_4$, MgO, $LiAlO_2$, $LiGaO_2$, or GaN. The substrate 105 may include the front surface 105s1 and the rear surface 105s2 opposed to the front surface 105s1.

In some example embodiments, a concavo-convex structure may be formed on the front surface 105s1 of the substrate 105. In some example embodiments, the concavo-convex structure may not be formed on the front surface 105s1 of the substrate 105.

The light-emitting structure 110 may be formed on the front surface 105s1 of the substrate 105. The light-emitting structure 110 may be formed in a plurality of layers formed by a metal organic chemical vapor deposition (MOCVD) process, a hydride vapor phase epitaxy (HVPE) process, a molecular beam epitaxy (MBE) process, or the like. For example, the light-emitting structure 110 may include the first conductivity-type semiconductor layer 115, the active layer 120, and the second conductivity-type semiconductor layer 125, sequentially formed on the front surface 105s1 of the substrate 105. The first conductivity-type semiconductor layer 115 may have a different conductivity type from the second conductivity-type semiconductor layer 125. For example, the first conductivity-type semiconductor layer 115 may have n-type conductivity, and the second conductivity-type semiconductor layer 125 may have p-type conductivity. In addition, the first transparent electrode layer 140 may be formed on the light-emitting structure 110.

Figure 9:
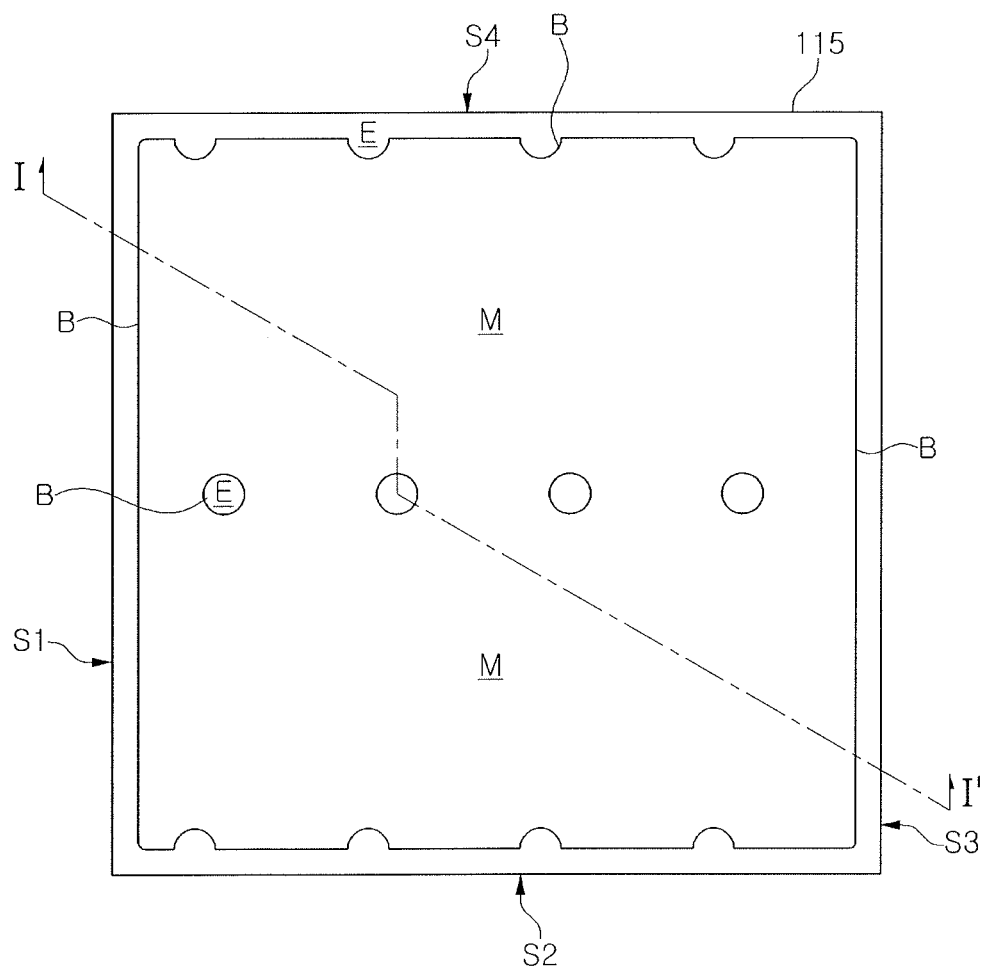
Figure 10:
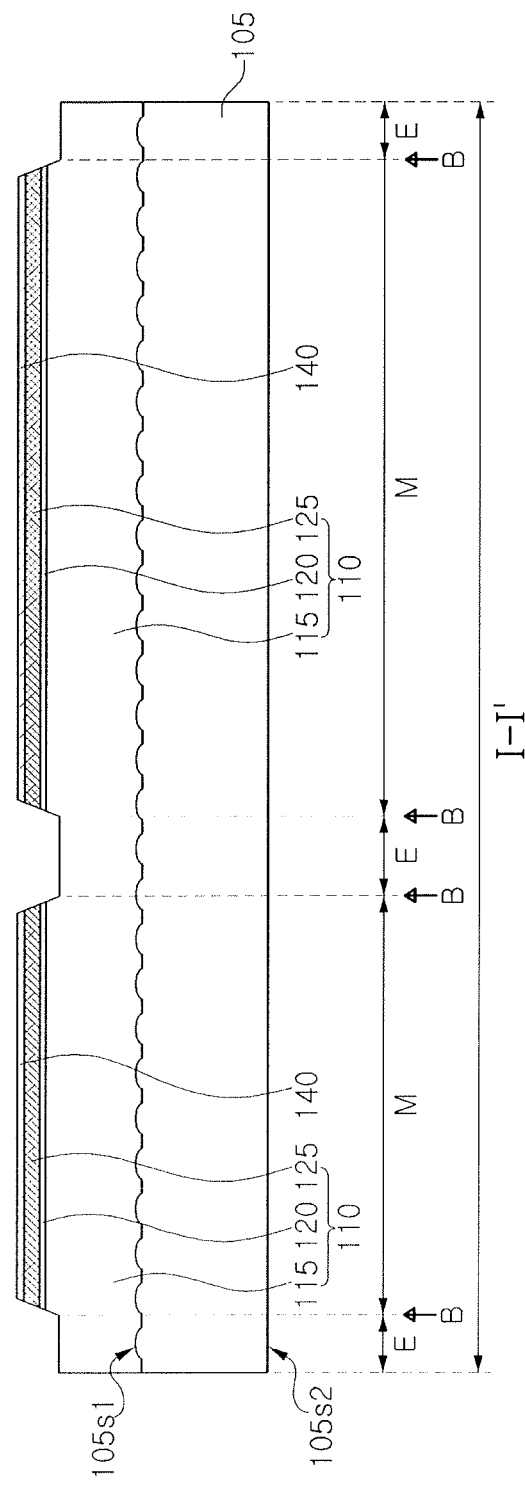

Referring to FIGS. 9 and 10, the first transparent electrode layer 140, the second conductivity-type semiconductor layer 125, the active layer 120, and a portion of the first conductivity-type semiconductor layer 115 may be etched using a photolithography and etching process. Accordingly, the light-emitting structure 110 may include the recess region E, in which the second conductivity-type semiconductor layer 125, the active layer 120, and the portion of the first conductivity-type semiconductor layer 115 are removed, and the mesa region M disposed around the recess region E (FIG. 9). The mesa region M may be defined as a region in which the second conductivity-type semiconductor layer 125, the active layer 120, and the first conductivity-type semiconductor layer 115 are not etched. The mesa region M may have a relatively protruding shape compared to the recess region E (FIG. 10). The recess region E may be referred to as an etched region.

Figure 11:
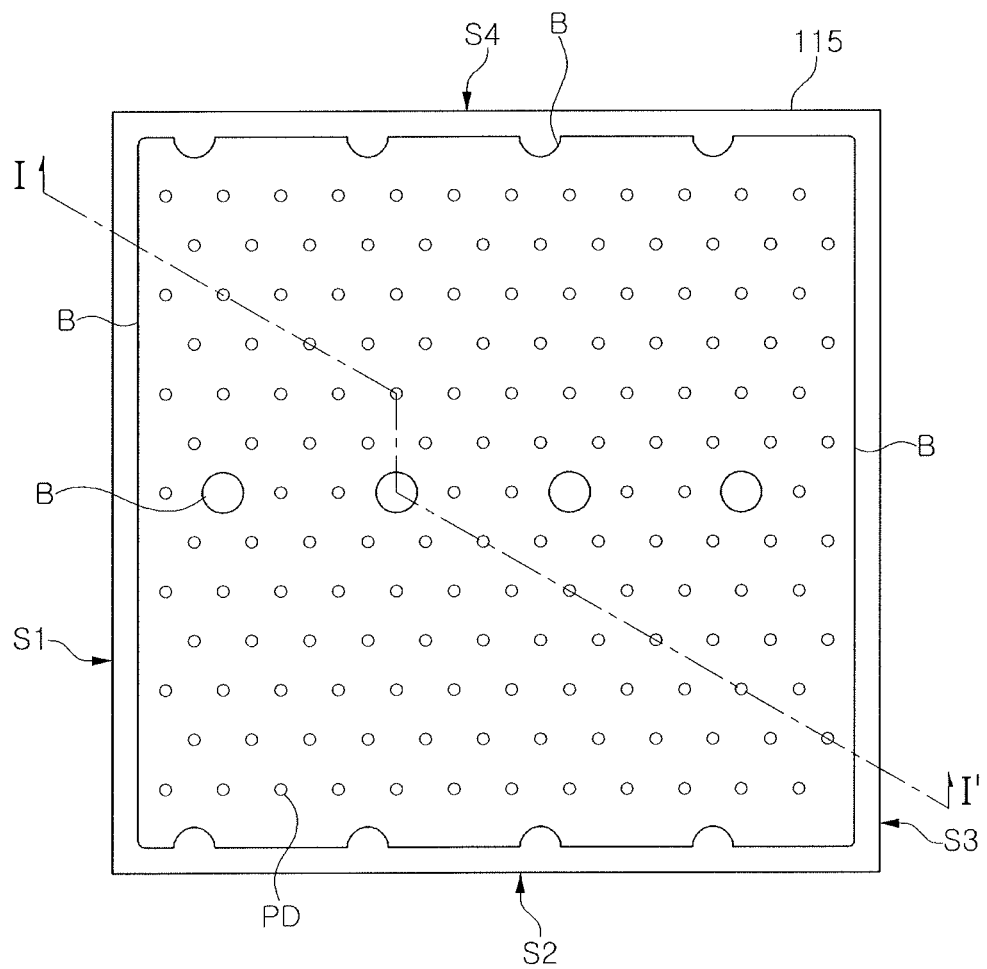
Figure 12:
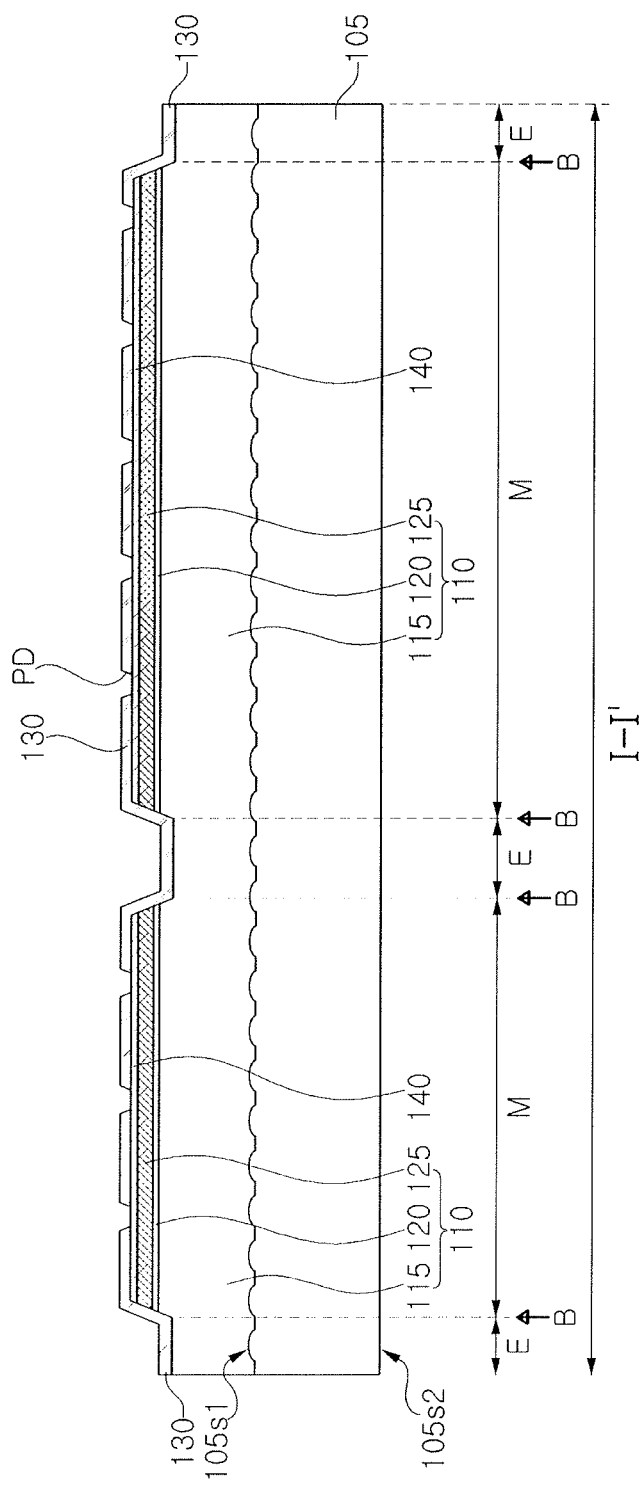

Referring to FIGS. 11 and 12, the first insulating layer 130 including the plurality of through-holes PD may be formed on the light-emitting structure 110. The plurality of through-holes PD of the first insulating layer 130 may partially expose the first transparent electrode layer 140. The plurality of through-holes PD may be disposed in the mesa region M.

Figure 13:
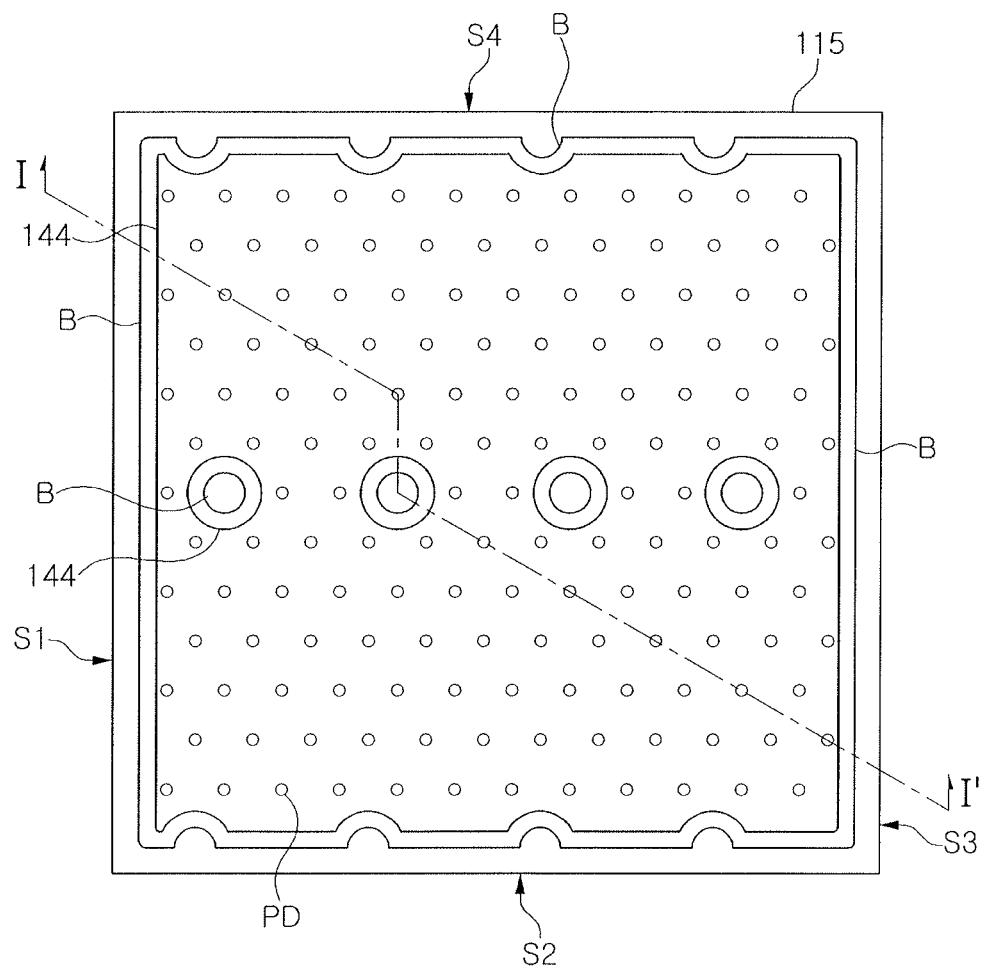
Figure 14:
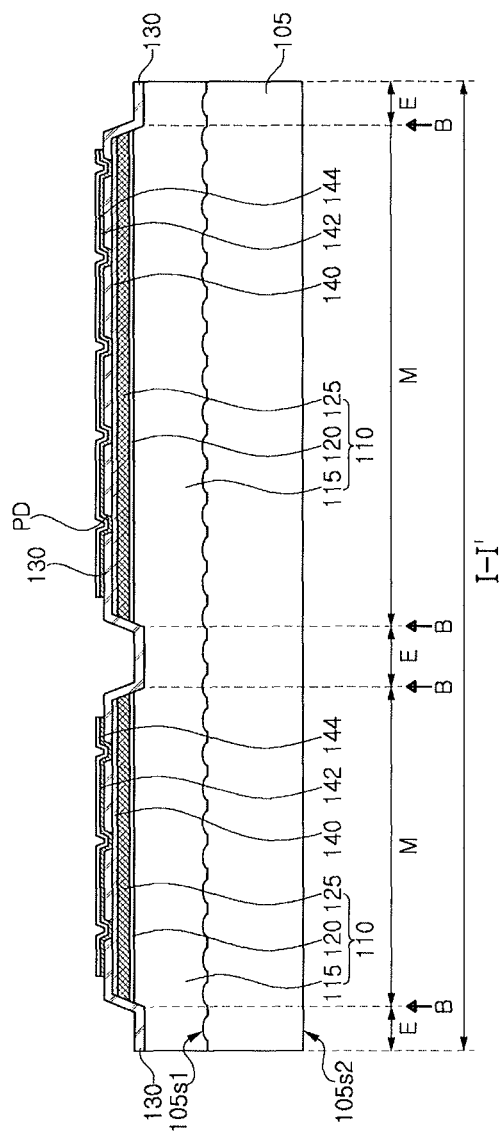

Referring to FIGS. 13 and 14, the second transparent electrode layer 142 and the reflective electrode layer 144 may be formed on the first insulating layer 130. The second transparent electrode layer 142 and the reflective electrode layer 144 may be formed in the mesa region M and on a portion of the first insulating layer 130.

Figure 15:
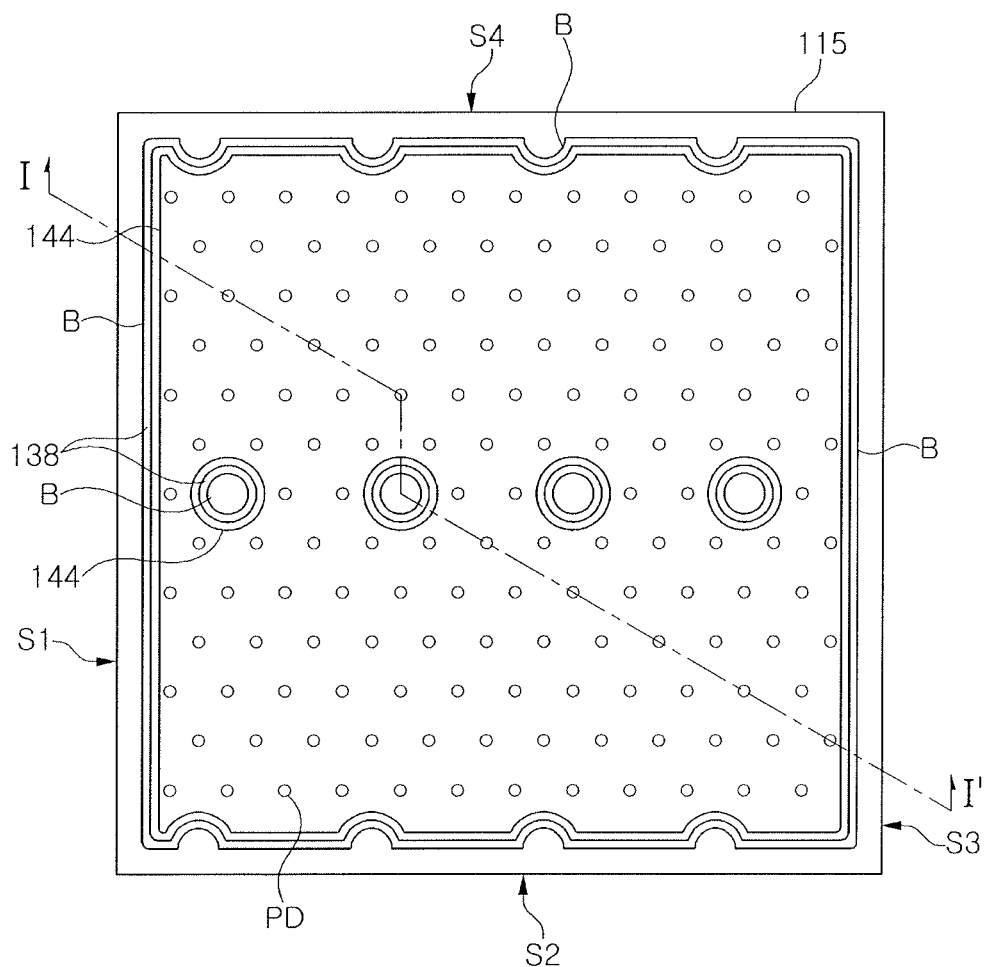
Figure 16:
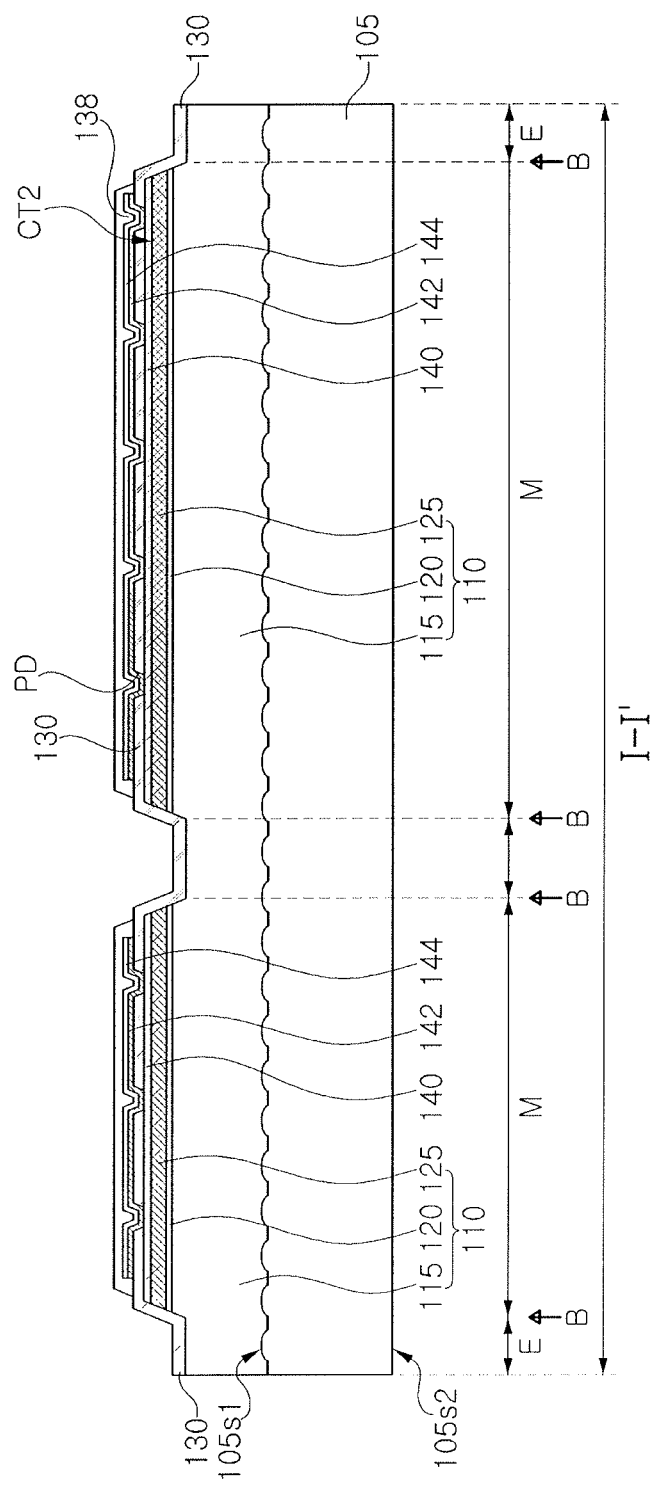

Referring to FIGS. 15 and 16, the transparent protection layer 138 may be formed on the reflective electrode layer 144. The transparent protection layer 138 may cover upper and side surfaces of the reflective electrode layer 144 and the side surface of the second transparent electrode layer 142. The transparent protection layer 138 may partially cover the first insulating layer 130 adjacent to the reflective electrode layer 144. The transparent protection layer 138 may be formed, for example, in a physical deposition process, e.g., sputtering, after forming a photoresist pattern exposing an area at which the transparent protection layer 138 is to be formed.

Figure 17:
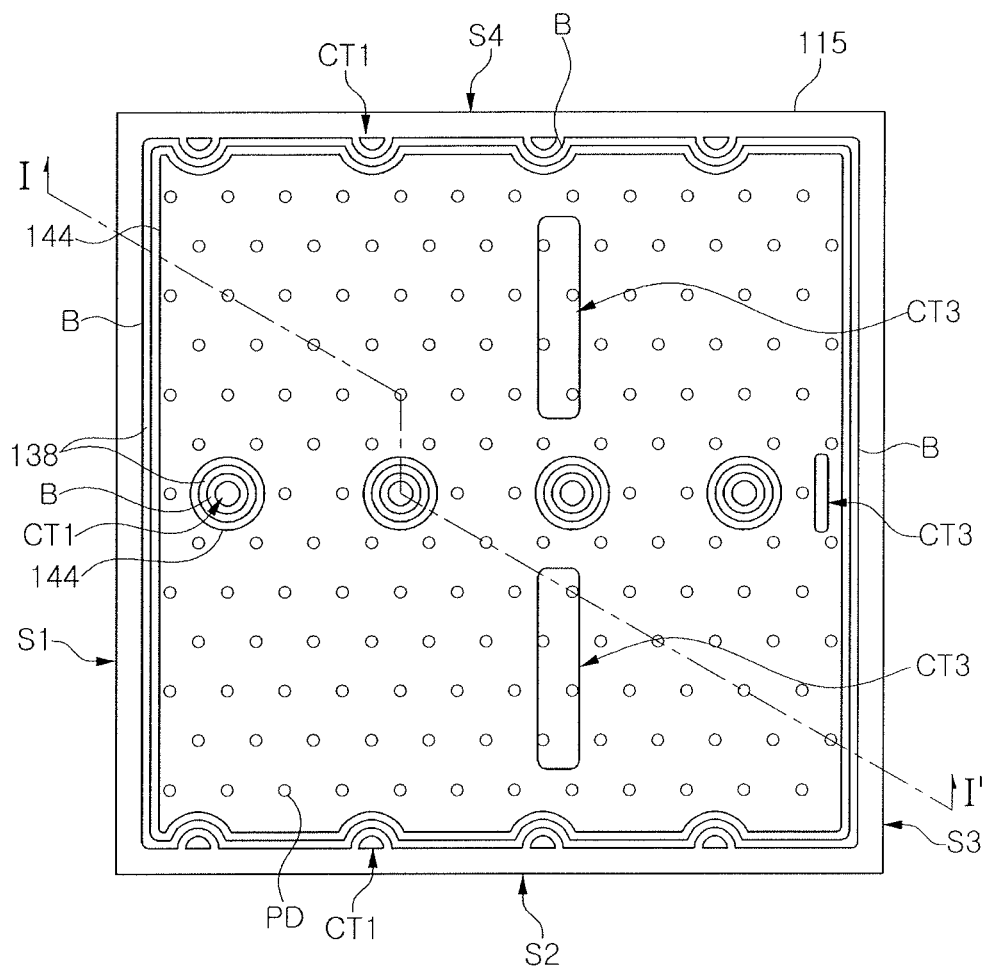
Figure 18:
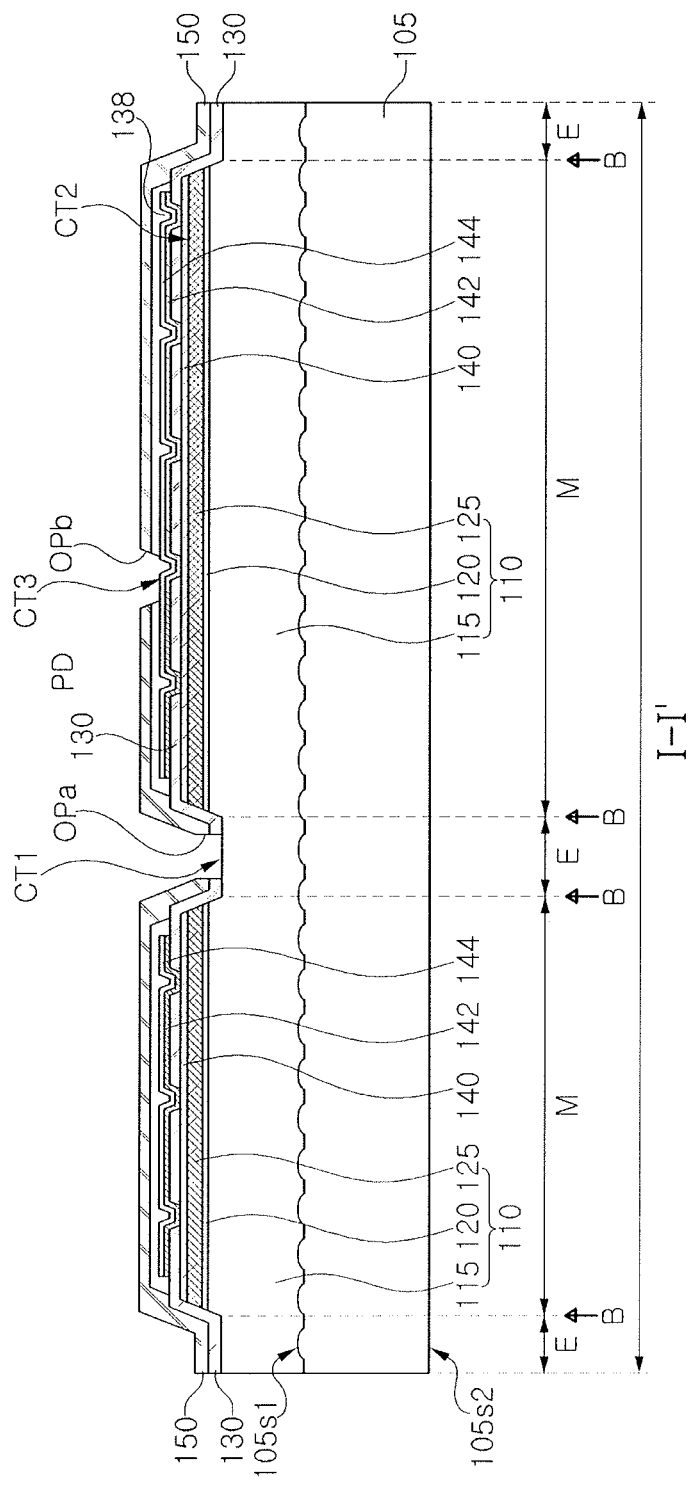

Referring to FIGS. 17 and 18, the second insulating layer 150 may be formed on the first insulating layer 130 and the transparent protection layer 138. The first opening OPa passing through the first insulating layer 130 and the second insulating layer 150 to partially expose the first conductivity-type semiconductor layer 115 in the recess region E, and the second opening OPb passing through the transparent protection layer 138 and the second insulating layer 150 to partially expose the reflective electrode layer 144 in the mesa region M, may be formed. A surface of the first conductivity-type semiconductor layer 115 exposed by the first opening OPa may be referred to as a first contact area CT1, and a surface of the reflective electrode layer 144 exposed by the second opening OPb may be referred to as a third contact area CT3.

Figure 19:
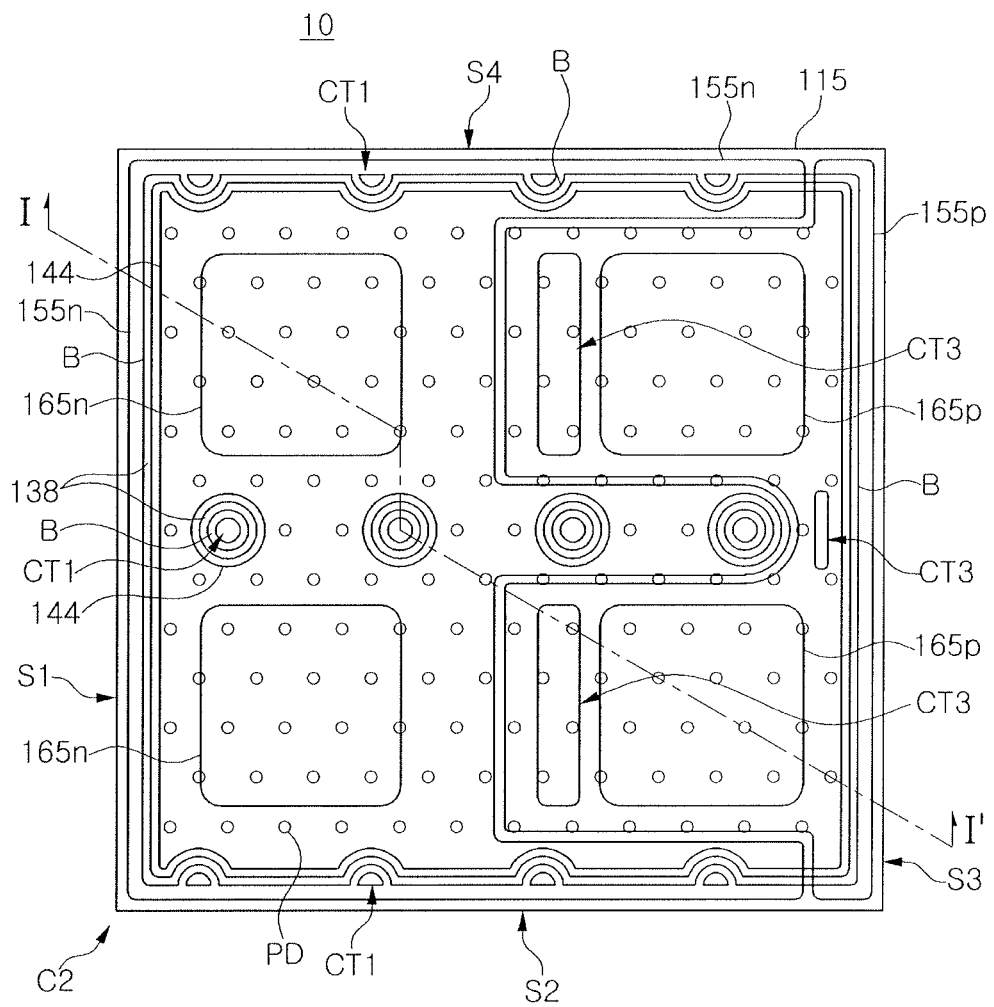
Figure 20:
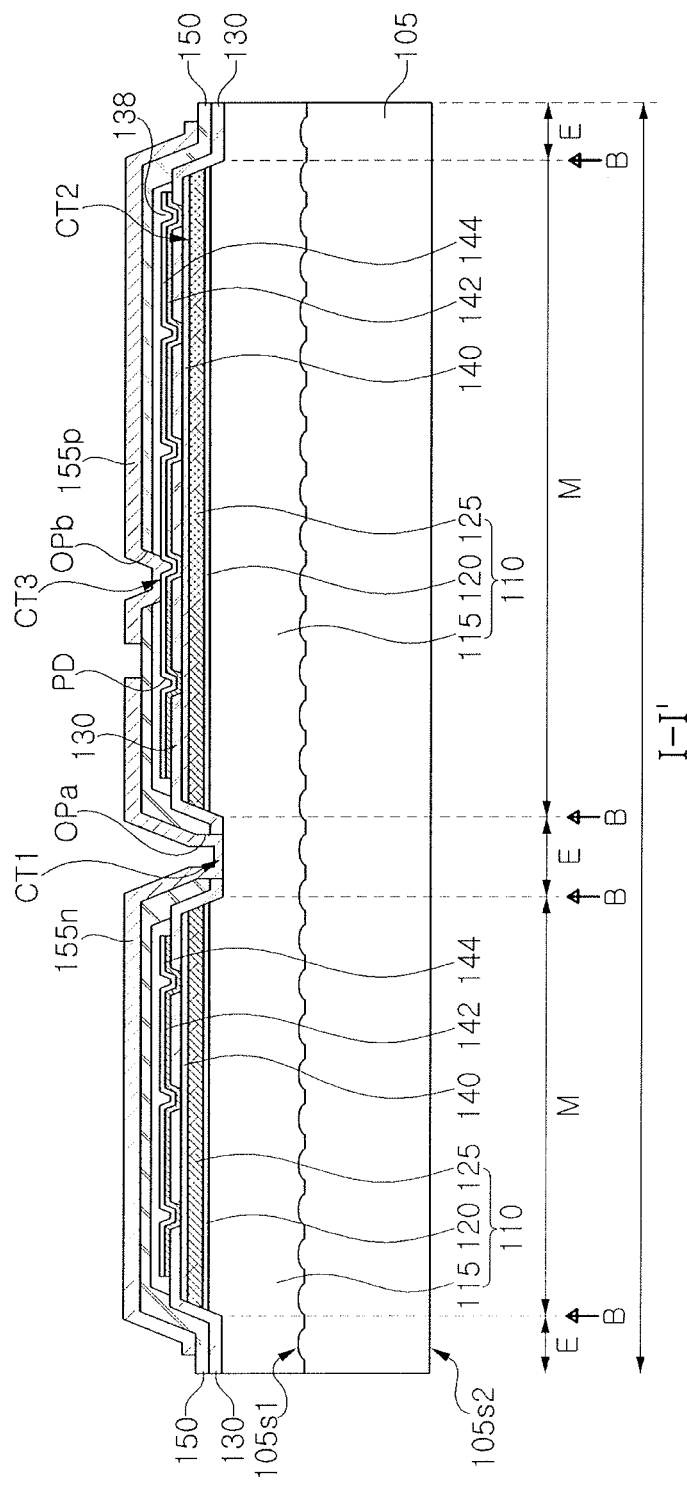

Referring to FIGS. 19 and 20, the first connection electrode 155n and the second connection electrode 155p may be formed on the substrate 105 including the second insulating layer 150. The formation of the first connection electrode 155n and the second connection electrode 155p may include forming a conductive material layer on the substrate 105 including the second insulating layer 150 and partially etching the conductive material layer using a photolithography and etching process. Since the first connection electrode 155n and the second connection electrode 155p are simultaneously formed in a single process, they are formed of the same material. The first connection electrode 155n and the second connection electrode 155p may have the same thickness.

The first connection electrode 155n may be electrically connected to the first contact area CT1 of the first conductivity-type semiconductor layer 115. The second connection electrode 155p may be electrically connected to the third contact area CT3 of the reflective electrode layer 144.

Referring again to FIGS. 1 and 2, the third insulating layer 160 including the third opening 160a and the fourth opening 160b may be formed on the substrate 105 including the first connection electrode 155n and the second connection electrode 155p. The third opening 160a of the third insulating layer 160 may expose a portion of the first connection electrode 155n, and the fourth opening 160b of the third insulating layer 160 may expose a portion of the second connection electrode 155p.

The portion of the first connection electrode 155n exposed by the third opening 160a of the third insulating layer 160 may be referred to as the fourth contact area CT4, and the portion of the second connection electrode 155p exposed by the fourth opening 160b of the third insulating layer 160 may be referred to as the fifth contact area CT5. The first and second electrode pads 165n and 165p may be formed on the substrate 105 including the third insulating layer 160. The first electrode pad 165n may be formed on the fourth contact area CT4 of the first connection electrode 155n, and the second electrode pad 165p may be formed on the fifth contact area CT5 of the second connection electrode 155p. The first and second electrode pads 165n and 165p may be under bump metallurgy (UBM) layers. In some example embodiments, the number and arrangement of the first and second electrode pads 165n and 165p may be variously modified.

The first and second solder pillars 170n and 170p may be formed on the substrate 105 including the first and second electrode pads 165n and 165p. The first solder pillar 170n may be formed on the first electrode pad 165n, and the second solder pillar 170p may be formed on the second electrode pad 165p.

The molding portion 172 covering side surfaces of the first and second solder pillars 170n and 170p may be formed. The molding portion 172 may include light-reflective powder, e.g., $TiO_2$ or $Al_2O_3$.

Figure 21:
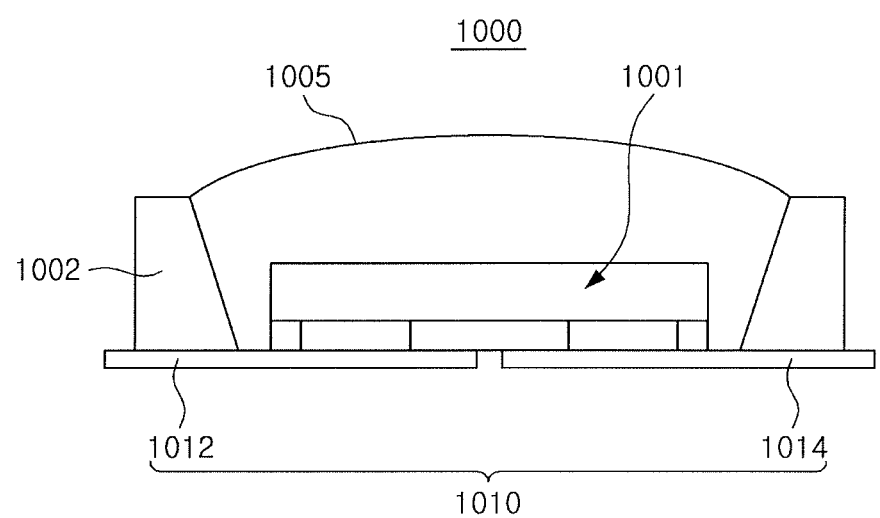
FIG. 21 illustrates a schematic cross-sectional view of an example of a package including a semiconductor light emitting device according to an example embodiment.

The semiconductor light emitting device 10 as described above may be commercialized in package form. Hereinafter, an example of the semiconductor light emitting device 10 applied to a package will be described with reference to FIG. 21. FIG. 21 is a cross-sectional view schematically illustrating an example of a package including a semiconductor light emitting device according to an example embodiment.

Referring to FIG. 21A, a semiconductor light emitting device package 1000 may include a semiconductor light emitting device 1001 as a light source, a package body 1002, a pair of lead frames 1010, and an encapsulant 1005. Here, the semiconductor light emitting device 1001 may be the semiconductor light emitting device 10 illustrated in FIGS. 1 to 6, and detailed descriptions thereof will be omitted.

The semiconductor light emitting device 1001 may be mounted on the lead frames 1010 and electrically connected to the lead frames 1010. The pair of lead frames 1010 may include a first lead frame 1012 and a second lead frame 1014. Referring to FIGS. 2 and 21, the semiconductor light emitting device 1001 may be connected to the first lead frame 1012 and the second lead frame 1014 by the first and second solder pillars 170n and 170p (of FIG. 2).

The package body 1002 may have a reflective cup to enhance light reflection efficiency and light extraction efficiency. The encapsulant 1005 formed of a light-transmissive material may be formed in the reflective cup to encapsulate the semiconductor light emitting device 1001. The encapsulant 1005 may include a wavelength conversion material, e.g., a fluorescent material or a quantum dot.

By way of summation and review, as set forth above, a semiconductor light emitting device having improved luminous flux and reliability can be provided. That is, according to embodiments, the semiconductor light emitting device may include a p-type omnidirectional reflector (ODR) having a structure in which a thin transparent conductive oxide adhesion layer is interposed, as an adhesion layer, between a reflective metal, e.g., silver, and a dielectric material, with a transparent conductive/insulating material covering upper and side surfaces of the reflective metal. Accordingly, reflectance and light emission efficiency are increased, while peeling of the reflective metal or migration thereof can be suppressed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
   a light-emitting structure including a first conductivity-type semiconductor layer, an active layer, and a second conductivity-type semiconductor layer;
   a first transparent electrode layer on the second conductivity-type semiconductor layer;
   a first insulating layer on the first transparent electrode layer, the first insulating layer including a plurality of through-holes;
   a reflective electrode layer on the first insulating layer and connected to the first transparent electrode layer through the plurality of through-holes; and
   a transparent protection layer covering upper and side surfaces of the reflective electrode layer, the transparent protection layer being on a portion of the first insulating layer.

2. The semiconductor light emitting device as claimed in claim 1, wherein the transparent protection layer includes:
   an upper portion covering an upper surface of the reflective electrode layer, the upper portion having a convex surface; and
   a side portion covering a side surface of the reflective electrode layer, the side portion having an inclined surface.

3. The semiconductor light emitting device as claimed in claim 1, wherein the transparent protection layer includes a transparent insulating material.

4. The semiconductor light emitting device as claimed in claim 1, wherein the transparent protection layer includes a transparent conductive material.

5. The semiconductor light emitting device as claimed in claim 1, wherein the first insulating layer includes at least one of $SiO_2$, SiN, $TiO_2$, HfO, and $MgF_2$.

6. The semiconductor light emitting device as claimed in claim 1, wherein the first insulating layer has a distributed Bragg reflector (DBR) structure in which insulating layers having different refractive indices are alternately stacked.

7. The semiconductor light emitting device as claimed in claim 1, wherein the reflective electrode layer includes Ag, Cr, Ni, Ti, Al, Rh, Ru, or a combination thereof.

8. The semiconductor light emitting device as claimed in claim 1, further comprising a second transparent electrode layer between the first insulating layer and the reflective electrode layer.

9. The semiconductor light emitting device as claimed in claim 8, wherein the second transparent electrode layer is in contact with the first transparent electrode layer through the plurality of through-holes.

10. The semiconductor light emitting device as claimed in claim 1, further comprising a capping electrode layer between the reflective electrode layer and the transparent protection layer.

* * * * *